US006959134B2

(12) United States Patent
Tran et al.

(10) Patent No.: US 6,959,134 B2
(45) Date of Patent: Oct. 25, 2005

(54) MEASURING THE POSITION OF PASSIVELY ALIGNED OPTICAL COMPONENTS

(75) Inventors: Ut Tran, San Jose, CA (US); Hamid Eslampour, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 10/609,804

(22) Filed: Jun. 30, 2003

(65) Prior Publication Data

US 2004/0264869 A1 Dec. 30, 2004

(51) Int. Cl.[7] .................................................. G02B 6/42

(52) U.S. Cl. ........................... 385/52; 385/50; 359/811

(58) Field of Search ............................. 385/14, 50, 51, 385/52; 359/811

(56) References Cited

U.S. PATENT DOCUMENTS 6,151,173 A * 11/2000 Massit et al. ............... 359/811
2002/0159719 A1 10/2002 Ide et al.
2002/0168147 A1 11/2002 Case et al.

FOREIGN PATENT DOCUMENTS

EP 1 304 543 4/2003
EP 1 304 543 A1 * 4/2003

* cited by examiner

*Primary Examiner*—Phan T. H. Palmer
(74) *Attorney, Agent, or Firm*—Trop, Pruner & Hu, P.C.

(57) ABSTRACT

Optical components may be precisely positioned in three dimensions with respect to one another. A bonder which has the ability to precisely position the components in two dimensions can be utilized. The components may be equipped with contacts at different heights so that as the components come together in a third dimension, their relative positions can be sensed. This information may be fed back to the bonder to control the precise alignment in the third dimension.

6 Claims, 4 Drawing Sheets

MEASURING THE POSITION OF PASSIVELY ALIGNED OPTICAL COMPONENTS

BACKGROUND

This invention relates generally to the assembly of components for optical communication networks.

In optical networks, a number of components may be placed on a structure, such as an optical bench or a planar lightwave circuit. It is advantageous to precisely position these structures using high precision flip chip bonders. However, such bonders are only able to provide alignment in the X and Z coordinates, which basically exist in a plane corresponding to the plane of the optical bench or the planar lightwave circuit.

These bonders do not control the positioning in the transverse or Y direction normal to the surface of the bench or circuit. Unfortunately, optical coupling efficiency between components is also highly dependent on the Y-height placement. However, the present inventors know of no methodology or tooling to address the Y-height placement aspect.

Thus, there is a need for better ways to provide alignment operations for building passive optical devices.

DETAILED DESCRIPTION

Figure 1:
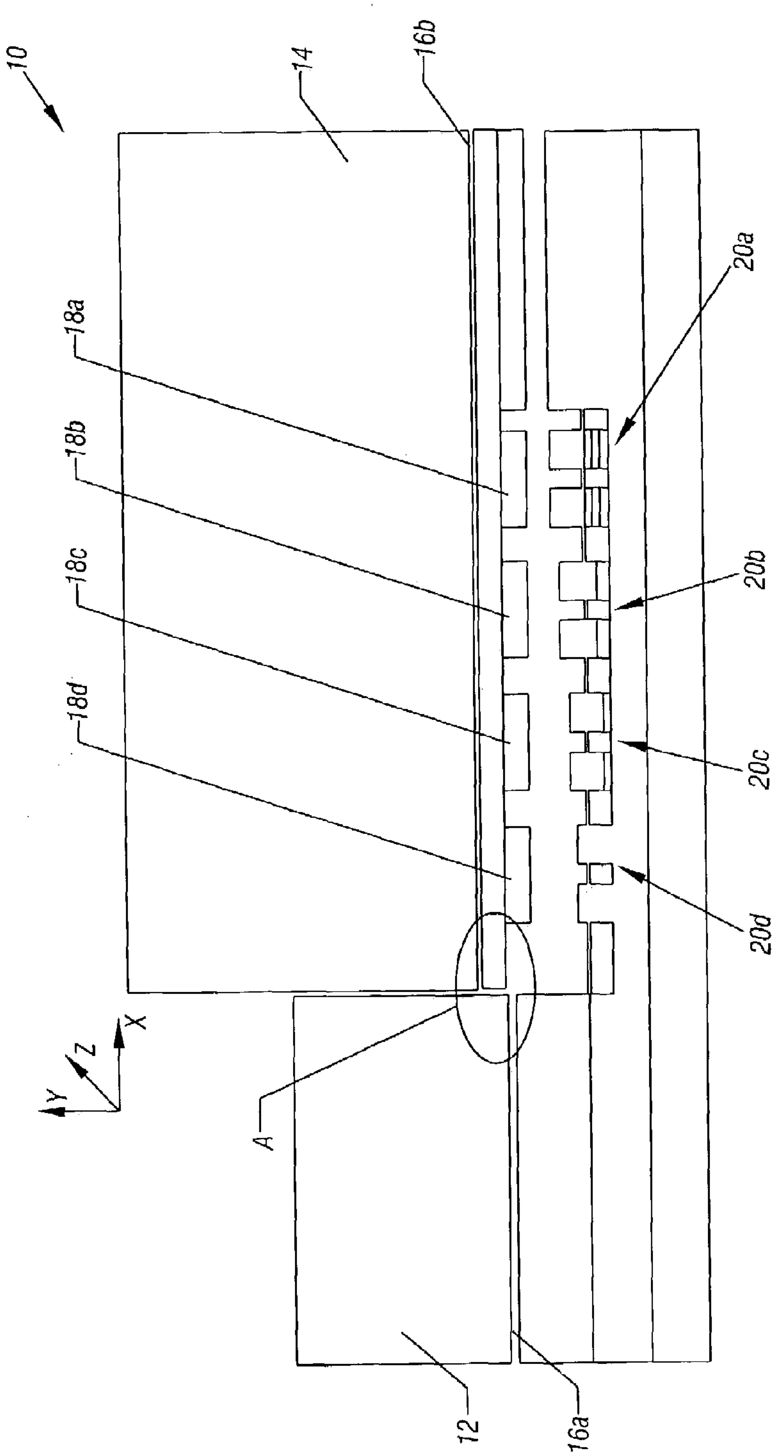
FIG. 1 is an enlarged, cross-sectional view of one embodiment of the present invention.

Referring to FIG. 1, an optical amplifier 14 may be positioned on a silicon optical bench or planar lightwave circuit 12 in one embodiment of the present invention. The bench 12 may be L-shaped in cross section in one embodiment of the present invention. The bench 12 and the optical amplifier 14 may each have a part 16*a*, 16*b* of a waveguide 16 that ultimately needs to be aligned. Thus, it is desirable to use a high precision flip chip bonder or other chip placement tool to position the amplifier 14 precisely on the bench 12 so that the portion 16*a* of the waveguide lines up with the portion 16*b* of the waveguide on the separate bench 12 and amplifier 14.

Though the present description speaks of amplifiers and benches, the present invention is applicable to aligning and positioning any optical component with respect to any other optical component. Thus, the discussion of optical amplifiers and benches is merely meant as an illustrative example.

The amplifier 14 may have a bonding pad 18 including a plurality of portions 18*a*–18*d*. Each of the portions 18*a*–18*d* may be a distinct portion that extends downwardly from the amplifier 14 and is separated from adjacent portions in one embodiment.

Conversely, on the bench 12; a plurality of bonding pads 20*a*–20*d* may be provided which extend upwardly and which are distinct and separate from their respective neighbors in one embodiment. In one embodiment, the bonding pads 20 and the bonding pads 18 are made of the same material, such as gold. However, the bonding pads 20*a*–20*d* have a stepped configuration such that the height of the pads 20*a* is higher than the pads 20*b*, which is higher than the pads 20*c*, which is higher than the pads 20*d*.

Thus, when the amplifier 14 is lowered onto the bench 12, one or more of the pads 18 makes physical contact with one or more of the pads 20. However, as shown in FIG. 1, there is no contact between any of the pads 18 or any of the pads 20 since the amplifier 14 and bench 12 are being positioned in the Y direction. The physical contact between particular pads 18 and 20 may also close an electrical switch 21 whose contacts are formed by the pads 18 and 20.

Figure 2:
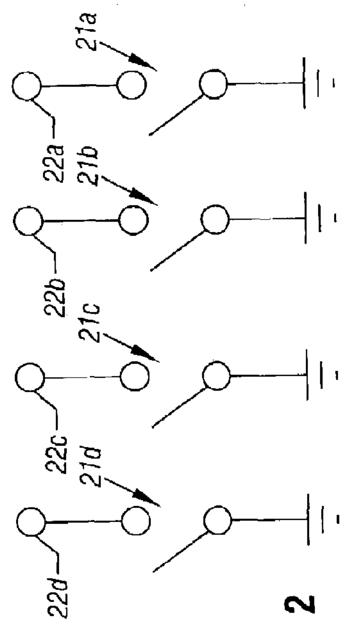
FIG. 2 is a schematic depiction of the embodiment shown in FIG. 1.

Thus, referring to FIG. 2, the pads 18 and 20 form a plurality of switches 21 (which are closed when the pads 18 make contact with their aligned pads 20). The switches 21 are shown in their open position because no contact has been established between pads 18 and 20 in FIG. 1. The switches 21*a*–21*d* in FIG. 2 are coupled to a contact 22*a*–22*d*. The contact 22 may be probed by a probing tool or other device to determine whether or not the switches 21 are open or closed.

Depending on which switches 21 are closed, the precise Y dimension orientation of the amplifier 14 and the bench 12, relative to one another, can be determined. In particular, since each pad 20 may have a different height in one embodiment, closure of any switch 21 indicates a relative spacing between the amplifier 14 and bench 12.

Figure 3:
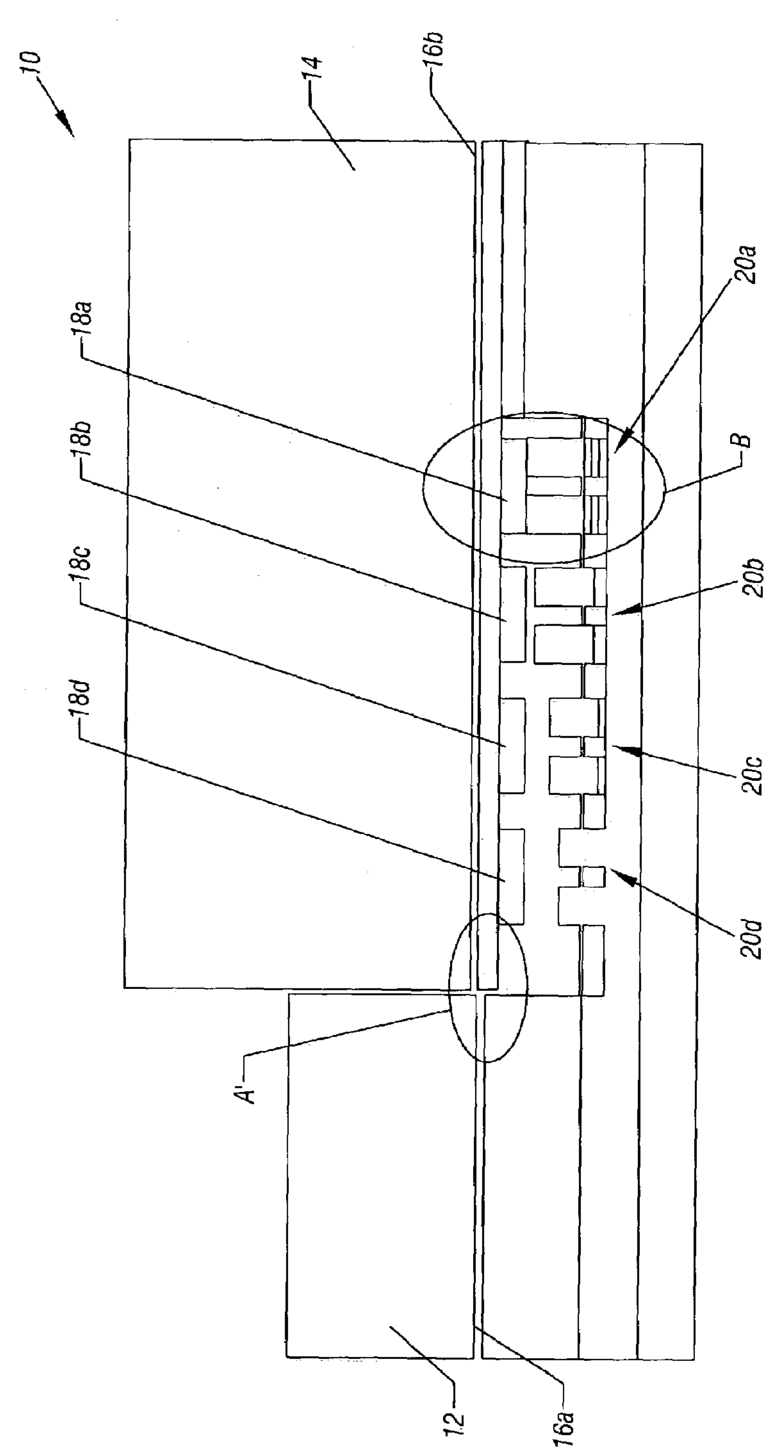
FIG. 3 is an enlarged, cross-sectional depiction of another embodiment of the present invention.
Figure 4:
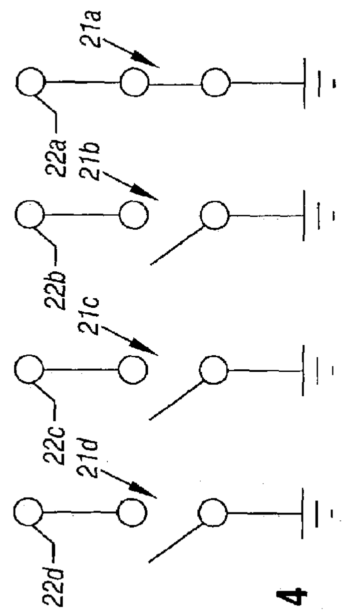
FIG. 4 is a schematic depiction of the embodiment shown in FIG. 3.

For example, referring to FIG. 3, the pad 18*a* has now made contact with the pad 20*a*, as indicated at B. Thus, referring to FIG. 4, the switch 21*a* is closed, but the other switches 21 remain open. As indicated at A', the waveguide portions 16*a* and 16*b* are still not precisely aligned.

Figure 5:
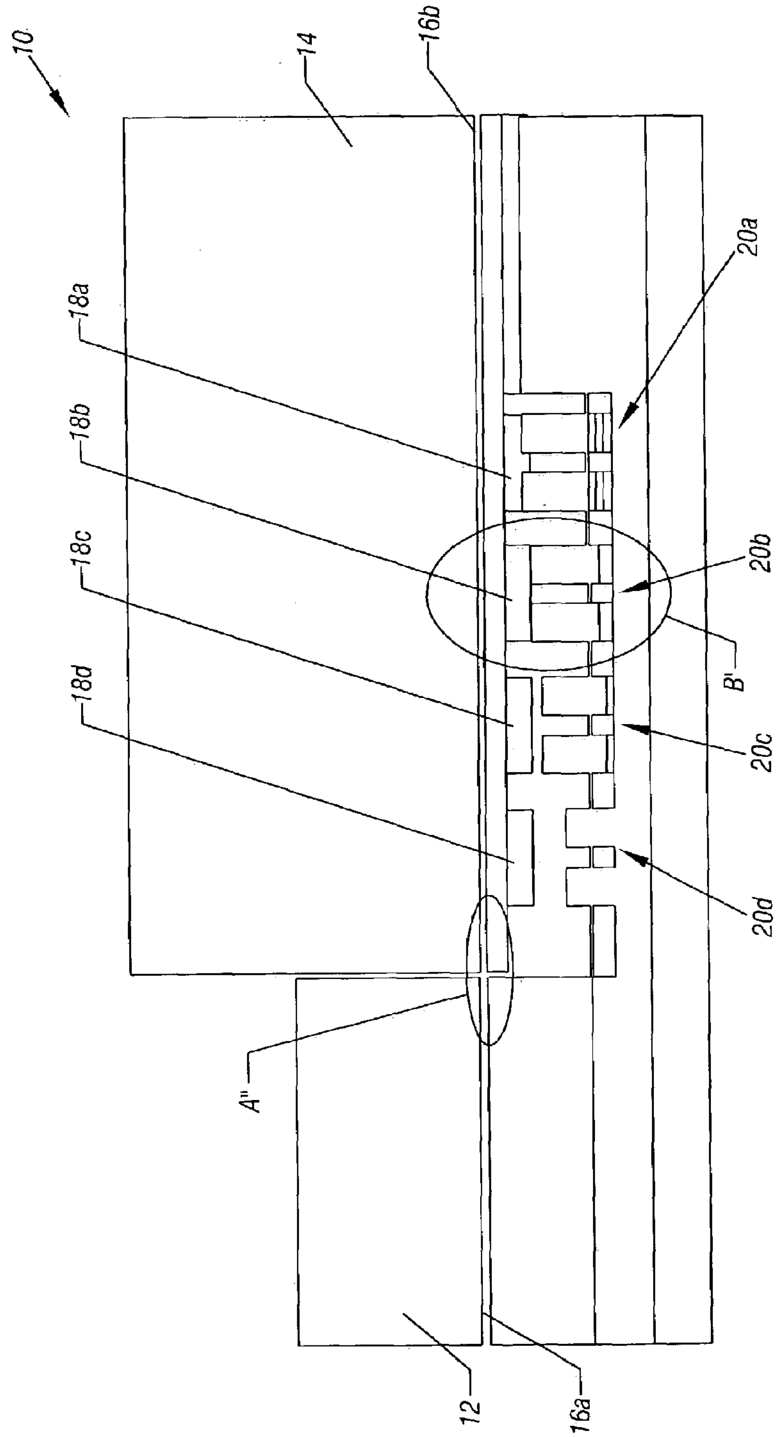
FIG. 5 is an enlarged, cross-sectional view of still another embodiment of the present invention.
Figure 6:
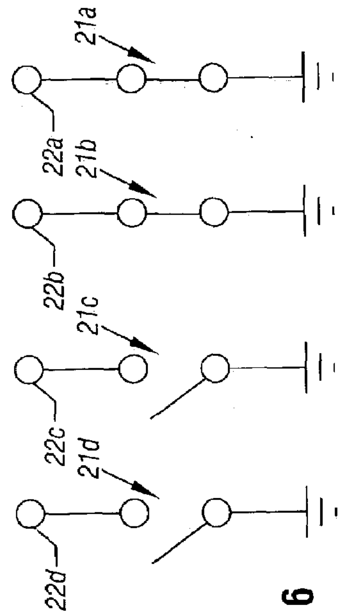
FIG. 6 is a schematic depiction of the embodiment shown in FIG. 5.

Referring to FIG. 5, after further displacement in the Y dimension, the pad 18*b* now also contacts the pad 20*b*, as shown in B'. To achieve this result, the pad 18*a* may be deformed in one embodiment. In this position, the waveguide portions 16*a* and 16*b* are precisely aligned as shown at A". Here, the switches 21*b* and 21*a* are both closed and the switches 21*c* and 21*d* are both open as shown in FIG. 6. Thus, the precise relative positions in the Y dimension can be determined to any desired granularity. More or fewer switches 21 may be provided to achieve the desired results, with variations in their heights in units of 0.2 nm, for example, or any other value such as 0.05 nm or 0.5 nm as desired for the particular application.

The flip chip bonder has precise alignment in the X and Z coordinates. Through the provision of the switches 21, precise alignment can be obtained in the Y direction. Therefore, the precise positioning of the parts is possible on a real time basis in some embodiments of the present invention. Rapid, nondestructive screening and sorting may also be accomplished using for example a prober to determine the resistance of the switches after the bonding step has been completed.

In some embodiments, the switches 21 may be fabricated during wafer processing using combinations of masking and etching, dry or wet, and the same process steps as deposition, via etch, and the like. Resolution of the switches 21 may be defined by the thicknesses of the respective pads 18, 20. Since the pads 18 and 20 define the switches 21, a material to facilitate electrical contact (such as gold) may be provided on the facing surfaces of the pads 18 and 20.

During the bonding process, a metal on the amplifier 14 side may deform or shrink to enable bond establishment between the amplifier 14 and bench 12. The deformation stops when the bonding force is withdrawn. This action facilitates the connection of the bond pad 18 on the amplifier 14, connecting or shorting the switches 21 at different step heights. Depending on the degree of deformation or transformation of the pads 18 on the amplifier 14, more or fewer contacts may be closed. By measuring the resistance of the switches 21 after bonding, one can determine the distance (and/or deformation) in the Y dimension of the amplifier 14 relative to the bench 12.

The construction of the switches 21 can be reversed depending on the overall process sequence. Pads of different heights may be fabricated on the amplifier 14 and the mating pads may be provided on the bench 12 in another embodiment. The concept of the switches 21 can be extended to checking other critical bonding factors which determine coupling efficiency, such as bonding integrity, tilt angle, and rotation angle.

The Y-height can be determined immediately after bonding by checking the switches 21 using wafer probing. In cases where the bench is a wafer and multiple components are aligned using this method, the prober may provide a wafer map for sorting and the wafer map may reduce the cost of testing for bad bench/amplifier combinations 10, translating to lower cost of the overall product in some embodiments. With a continuity meter or prober communicating with the bonder, besides the X and Z coordinates, the real time Y-height bonding data can be fed back to the bonder for real time control. The feedback may facilitate the optical passive alignment and high volume production and, therefore, may further reduce manufacturing costs.

Figure 7:
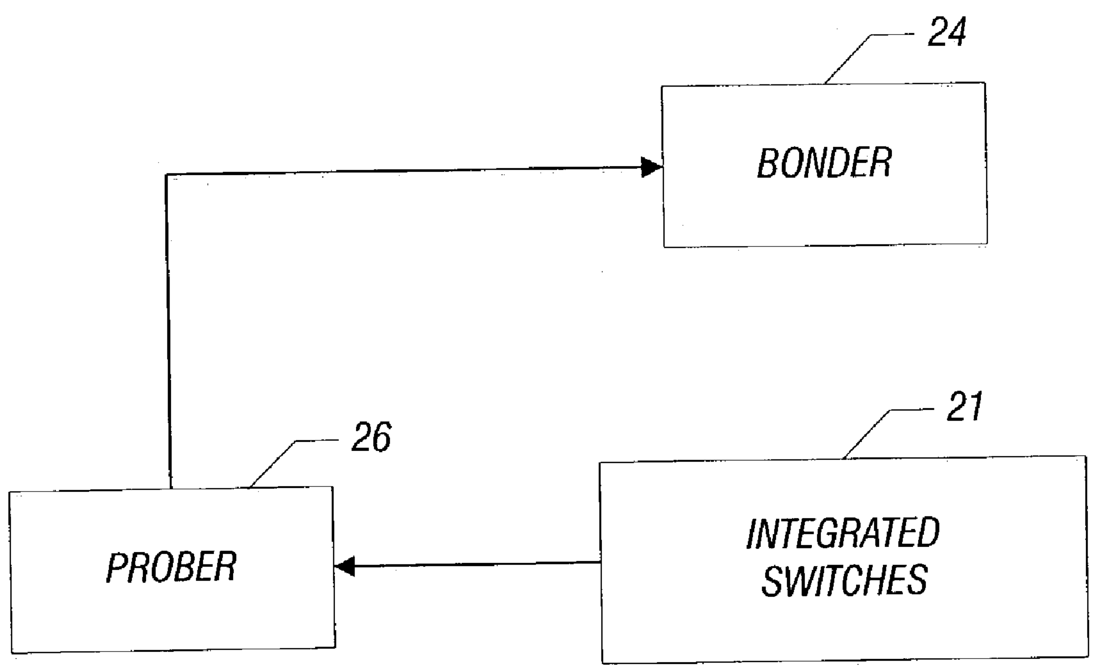
FIG. 7 is a schematic depiction of another embodiment.

Referring to FIG. 7, the amplifier 14 and bench 12 may be represented by integrated switches 21. Those switches 21 sense the distance between the amplifier 14 and the bench 12. That information may be read out by a wafer prober or continuity tester 26 using the contacts 22. The information about what switches 21 are open and closed may then be converted into a relative position in the Y direction. That information may then be provided by the prober 26 back to the bonder 24. The bonder 24 may then appropriately position the amplifier 14 and bench 12 based on the desired orientation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

providing alignment between two optical components to be coupled;

measuring the position of one component relative to the other by providing at least two distinct points of contact; and electrically determining whether one or both points of contact have made contact.

2. The method of claim 1 wherein measuring the position of one component relative to the other includes sensing the position of a plurality of stepped elements.

3. The method of claim 2 including measuring the position of one component relative to the other by providing at least three relatively displaced points of contact and electrically determining whether those points of contact have made contact.

4. The method of claim 1 wherein alignment between optical components to be coupled is provided using a bonder to position the components in two dimensions.

5. The method of claim 1 including providing a first set of stepped contacts on one of said components and a plurality of contacts on the other component and sensing whether contacts are made between the contacts on one component and the contacts on the other component.

6. The method of claim 1 including aligning two optical components which include a waveguide that extends from one component to the other and aligning the waveguide by aligning said components.

* * * * *